(12) United States Patent
Rogers et al.

(10) Patent No.: US 10,285,292 B2
(45) Date of Patent: May 7, 2019

(54) TRANSPARENT PROTECTIVE COATING FOR A COMPONENT OF AN ELECTRONIC DEVICE

(71) Applicant: Apple Inc., Cupertino, CA (US)

(72) Inventors: Matthew S. Rogers, Cupertino, CA (US); Que Anh S. Nguyen, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 314 days.

(21) Appl. No.: 15/178,502

(22) Filed: Jun. 9, 2016

(65) Prior Publication Data

US 2016/0366777 A1    Dec. 15, 2016

Related U.S. Application Data

(60) Provisional application No. 62/174,514, filed on Jun. 11, 2015.

(51) Int. Cl.
   *H05K 5/03*    (2006.01)
   *H04B 1/3888*  (2015.01)
   (Continued)

(52) U.S. Cl.
   CPC ............ *H05K 5/03* (2013.01); *C03C 17/007* (2013.01); *C03C 17/008* (2013.01); *C03C 17/22* (2013.01);
   (Continued)

(58) Field of Classification Search
   CPC ..... C03C 17/007; C03C 17/008; C03C 17/22; C03C 17/225; C03C 17/23;
   (Continued)

(56) References Cited

U.S. PATENT DOCUMENTS 6,861,134 B1   3/2005 Peters
9,056,988 B2   6/2015 Decker et al.
(Continued)

FOREIGN PATENT DOCUMENTS

EP   2500623    9/2012
TW   201500757  1/2015

OTHER PUBLICATIONS

Yau et al., "Investigation of nanocrystal-(Ti1-xAlx)Ny/amorphous-Si3N4 nanolaminate films," Surface and Coatings Technology, vol. 194, pp. 119-127, 2005.
(Continued)

*Primary Examiner* — Betelhem Shewareged
(74) *Attorney, Agent, or Firm* — Dorsey & Whitney LLP

(57) ABSTRACT

A transparent component of an electronic device having a nano-crystalline layer is disclosed. The nano-crystalline layer may be formed as a series of layers separated by or interspersed with one or more other layers including a non-crystalline or amorphous material. The series of layers may also be interspersed with one or more anti-reflective layers configured to reduce optical reflections off the transparent component. The nano-crystalline layer may be formed by a deposition process or by an ion-implanting and annealing process to form crystals having a size of less than 10 nanometers. The protective coatings may be utilized on portions of an electronic device, such as a housing or a cover glass, to protect the electronic device from scratching and/or damage caused by impact.

29 Claims, 13 Drawing Sheets

(51) Int. Cl.
*C23C 14/48* (2006.01)
*C03C 17/22* (2006.01)
*C03C 17/00* (2006.01)
*C03C 17/23* (2006.01)
*C03C 17/34* (2006.01)
*H04M 1/02* (2006.01)

(52) U.S. Cl.
CPC ............ *C03C 17/225* (2013.01); *C03C 17/23* (2013.01); *C03C 17/3411* (2013.01); *C03C 17/3417* (2013.01); *C03C 17/3435* (2013.01); *C03C 17/3452* (2013.01); *C23C 14/48* (2013.01); *H04B 1/3888* (2013.01); *C03C 2217/42* (2013.01); *C03C 2217/43* (2013.01); *C03C 2217/452* (2013.01); *C03C 2217/465* (2013.01); *C03C 2217/475* (2013.01); *C03C 2217/48* (2013.01); *C03C 2217/78* (2013.01); *H04M 1/0202* (2013.01); *Y10T 428/257* (2015.01); *Y10T 428/259* (2015.01)

(58) Field of Classification Search
CPC . C03C 17/3411; C03C 17/3435; C03C 17/45; C03C 17/475; C03C 17/478; C03C 17/92; Y10T 428/257; Y10T 428/259
See application file for complete search history.

(56) References Cited

U.S. PATENT DOCUMENTS

| | | | |
|---|---|---|---|
| 9,359,261 B2 | 6/2016 | Bellman et al. | |
| 2002/0032115 A1* | 3/2002 | Oguri | B64G 1/226 501/32 |
| 2005/0084718 A1* | 4/2005 | Tomonaga | C03C 17/007 428/698 |
| 2009/0153502 A1* | 6/2009 | Jiang | G06F 3/0412 345/173 |
| 2012/0327568 A1 | 12/2012 | Shedletsky et al. | |
| 2013/0209762 A1 | 8/2013 | Damm et al. | |
| 2014/0106141 A1 | 4/2014 | Bellman et al. | |
| 2014/0139978 A1 | 5/2014 | Kwong | |
| 2014/0220327 A1 | 8/2014 | Adib et al. | |
| 2016/0366777 A1* | 12/2016 | Rogers | C03C 17/007 |

OTHER PUBLICATIONS

Zhang et al., "Nanocomposite Thin Films for both Mechanical and Functional Applications," Advanced Materials for Micro- and Nano-Systems, 5 pages, 2004.
Invitation to Pay Additional Fees, PCT/US2016/03670, 7 pages, dated Sep. 5, 2016.

* cited by examiner

TRANSPARENT PROTECTIVE COATING FOR A COMPONENT OF AN ELECTRONIC DEVICE

CROSS-REFERENCE TO RELATED APPLICATIONS

This application is a nonprovisional patent application of and claims the benefit to U.S. Provisional Patent Application No. 62/174,514, filed Jun. 11, 2015 and titled "Transparent Protective Coatings," the disclosure of which is hereby incorporated herein by reference in its entirety.

FIELD

The described embodiments relate generally to protective coatings. More particularly, the present embodiments relate to transparent protective coatings and a method of forming the transparent protective coating.

BACKGROUND

Electronic devices typically include enclosures for protecting the internal components of the device. For example, conventional electronic devices may include a housing for containing and protecting the internal components of the electronic device. Devices that include a display or other optical component may include a transparent cover to protect the display from scratches and damage due to impact. It may be beneficial to enhance the hardness, strength, and/or durability of the transparent cover as described within the present disclosure.

SUMMARY

Embodiments described herein are directed to a transparent protective coating for a transparent substrate formed from glass, sapphire, or other transparent material. The transparent protective coating may be formed from a polycrystalline material that improves the hardness, strength, and/or toughness of the substrate. In some cases, the polycrystalline material is formed from nano-crystal structures having a size less than 10 nanometers. Because the crystal size is so small, any haze, clouding, or other optical artifact due to the presence of the coating may be minimized or reduced.

Some example embodiments are directed to an electronic device having an enclosure and a protective cover coupled to the enclosure and forming an exterior surface of the electronic device. The protective cover includes a transparent substrate and a series of transparent nano-crystalline layers formed over a surface of the transparent substrate. Each transparent nano-crystalline layer may have a thickness of less than 10 nanometers. There may be at least one transparent layer interspersed with the series of nano-crystalline layers. In some cases, the at least one transparent layer is formed from a non-crystalline material. In some cases, the at least one transparent layer is formed from an amorphous material. In some cases, the at least one transparent layer is formed from a polymer material.

In some embodiments, a first nano-crystalline layer of the series of transparent nano-crystalline layers includes crystals having a size of less than 6 nm. In some implementations, a first nano-crystalline layer of the series of transparent nano-crystalline layers includes crystals having a size of less than 10 nm. In some implementations, a first nano-crystalline layer of the series of transparent nano-crystalline layers has a layer thickness of between 2 nm and 6 nm.

In some cases, the transparent substrate is formed from one or more of: glass, sapphire, or zirconia. In some implementations, the series of transparent nano-crystalline layers includes at least 5 nano-crystalline layers, and the at least one transparent layer includes a non-crystalline layer interspersed between each of the nano-crystalline layers. In some cases, a total thickness of the series of transparent nano-crystalline layers and the interposed transparent layers is less than 5 microns. In some implementations, an anti-reflective layer is interspersed with the series of transparent nano-crystalline layers.

In some embodiments, a first nano-crystalline layer of the series of transparent nano-crystalline layers is formed from a material including one or more of: silicon dioxide, aluminum nitride, aluminum oxide, magnesium fluoride, or titanium dioxide.

Some example embodiments are directed to a method of forming a multilayer transparent protective coating. A first transparent layer may be formed on a surface of a substrate. A second transparent layer may be formed over the first transparent layer. One of the first or second transparent layers includes a crystalline layer has a thickness of less than 10 nanometers. One of the other of the first or second transparent layers has a thickness greater than 10 nanometers.

In some embodiments, forming the crystalline layer includes forming nano-crystalline structures less than 5 nanometers in size. In some cases, the crystalline layer is formed by: implanting ions into a matrix material of the crystalline layer; and annealing the crystalline layer to form crystal structures less than 5 nanometers in size. In some cases, the other of the first or second transparent layers is formed from a non-crystalline material. In some implementations, at least one anti-reflective layer is formed between the first and second transparent layers.

In some embodiments, the crystalline layer is formed by one or more of: a physical vapor deposition process; a chemical vapor deposition process; or an atomic layer deposition process.

Some example embodiments are directed to a protective cover for an electronic device including a glass sheet and a nano-crystalline layer disposed over a surface of the glass sheet. The nano-crystalline layer may include a matrix material and crystalline material grains suspended within the matrix material. In some cases, the crystalline material grains include nano-crystalline structures and the matrix material is an amorphous material. In some cases, the nano-crystalline structures have a size between 2 nanometers and 12 nanometers, and adjacent nano-crystalline structures are separated by a distance of approximately 1 to 5 nanometers. In some cases, the method includes forming a group of nano-crystalline layers separated by non-crystalline layers to form a protective coating on the glass sheet.

In some embodiments, the matrix material is formed from an oxide-based material, and the crystalline material grains are formed from one or more of: carbon nitride, silicon nitride, aluminum nitride, or oxynitride.

In some cases, the crystalline material grains includes a first group of crystalline material grains having a first characteristic, and at least one distinct group of crystalline material grains having a second characteristic, the second characteristic different from the first characteristic.

Some example embodiments are directed to a method of forming a transparent protective coating on a transparent substrate. A matrix material may be deposited over a surface of the transparent substrate. Ions may be implanted into the matrix material. The matrix material may be annealed to form a group of nano-crystalline structures suspended within the matrix material. In some cases, implanting ions into the matrix material is performed while annealing the matrix material. In some cases, the annealing is performed at a temperature between 100 and 900 degrees Celsius. Implanting ions into the matrix material may include providing accelerated ions to the matrix material. Annealing the matrix material may include introducing thermal energy to achieve phase segregation within the matrix material. In some embodiments, the ions are implanted into the matrix material while depositing the matrix material over the first surface of the transparent substrate.

Some example embodiments include a method that further comprises implanting a first group of crystalline material grains having a first characteristic into the matrix material, and implanting a second group of crystalline material grains having a second characteristic into the matrix material, the second characteristic distinct from the first characteristic.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
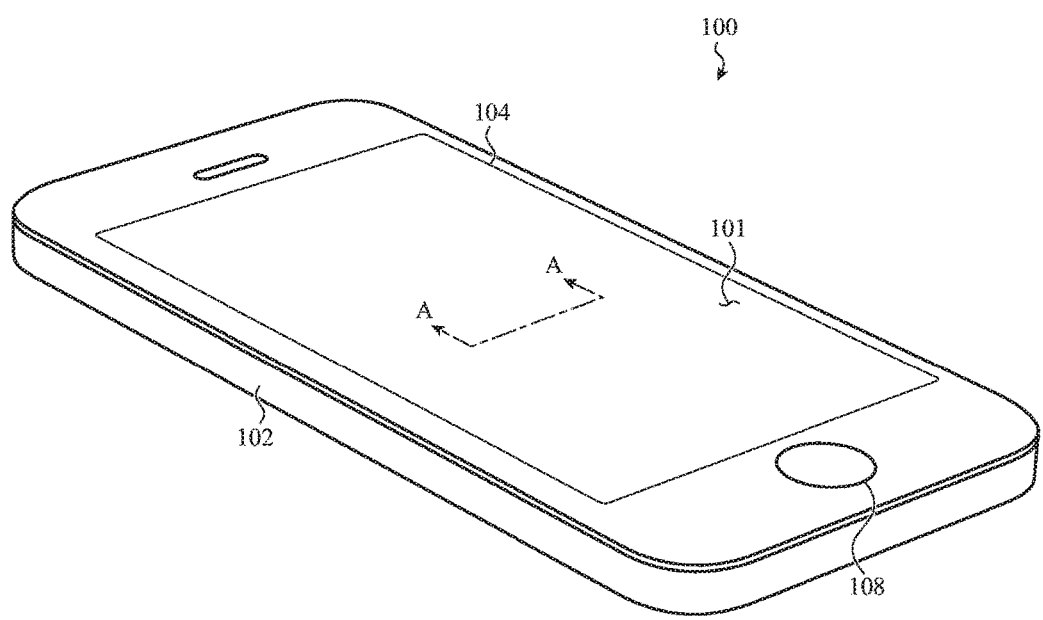
FIG. 1 depicts an electronic device that may include a transparent protective coating as discussed in some embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to transparent protective coatings and methods of forming transparent protective coatings. The transparent protective coatings may be formed on substrates or components for a variety of devices that require or may benefit from strengthening an exterior surface or component of the device. Some embodiments described herein are directed to transparent protective coatings formed on external components (e.g., housings, cover glass, etc.) of an electronic device to improve the hardness, strength, and/or toughness of the component. In some implementations, the transparent protective coating may be formed on an exposed surface of an external component of the electronic device to help reduce or minimize damage due to small surface defects (e.g., cracks) that may be formed on the external components over the operational life of the electronic device.

In some example embodiments, the transparent protective coating is formed from a series of thin crystalline (e.g., nano-crystalline) layers separated by one or more interstitial layers that are deposited or formed on a substrate. The substrate may form a protective cover over a portion of an exterior surface of an electronic device. The crystalline material may provide a hardened surface for the protective cover that may improve scratch resistance and also improve toughness and/or impact resistance of the protective cover. The nano-crystals within a layer may also prevent or reduce the propagation of surface defects or discontinuities. For example, the size of the nano-crystals within a layer may be so small that they do not allow a crack, defect, or other discontinuity to develop and grow into a size large enough to cause a failure of the component. By forming the protective coating from a nano-crystalline material, the strength, hardness, and/or toughness of the exterior of the device may be enhanced without significantly affecting the optical clarity or optical performance of the component. In some cases, the nano-crystals may be so small that they do not degrade or affect the light in a way that can be perceived by the human eye.

The protective coating may be formed from multiple layers having different properties, which may improve the impact resistance or toughness of the coated component. For example, one or more interstitial layers may be positioned between or adjacent to one or more thin crystalline (e.g., nano-crystalline) layers. The interstitial layers may be formed from a non-crystalline or amorphous material having a different composition and properties than the crystalline layer(s). In some cases, the interstitial layers may be more compliant and/or elastic as compared to the crystalline layers. The interstitial layers may reduce the propagation or transmission of stress due to an external force, such as an impact or shock. In some cases, the interstitial layers may help absorb and/or disperse the external force throughout the transparent protective coating.

In some embodiments, alternating multiple layers of crystalline (e.g., nano-crystalline) and non-crystalline material may enhance the strength or toughness of the protective cover. For example, the layers may help reduce or mitigate surface defects (e.g., cracks) formed within the protective coating that may have been caused by an impact or shock event. For example if a small crack or discontinuity is formed in the layer of crystalline material, the non-crystalline material may provide a boundary or borders that prevents or reduces the risk that the crack will spreading into other layers or the underlying substrate. By preventing or reducing the propagation of cracks and deformities, the toughness or impact resistance of the component may be improved.

As described herein, there are a variety of techniques for forming nano-crystalline structures for a transparent protective coating. In some implementations, the protective coating includes nano-crystalline structures formed as a thin layer or a series of thin layers. The layers may be less than 10 nm in thickness and may be formed using a deposition process (e.g., vapor, chemical, or atomic deposition). In other implementations, the nano-crystalline structures are formed within an amorphous or matrix material layer. The nano-crystalline structures may be formed over a substrate, like a glass sheet, using an ion-implanting or embedding process in combination with an elevated temperature or annealing process. The nano-crystalline structures, also referred to as crystalline material grains, may be formed within the amorphous material using an ion-implanting or embedding process, which allows the formation of crystalline material grains at temperatures that are much lower than using other techniques. This may allow the formation of nano-crystalline structures over glass substrates that may not be able to withstand high-temperature treatment. Additionally, the ion-implanting or embedding process may be used to implant different types of ions in the same matrix and allow for different types of crystalline material grains to form, which may further enhance the structural properties of the protective cover.

With regard to ion-implanting or embedding techniques, the crystalline material grains may improve the mechanical properties of a treated component without significantly affecting the optical performance. By forming groups of ion-implanted crystalline material grains spaced apart from one another or suspended in a matrix material, propagation of surface or material defects (e.g., cracks) may be reduced or minimized, which may improve the strength or toughness of the protective cover. Specifically, the small size of the crystalline material grains (e.g., nano-crystalline) and/or the minimal distance between each of the crystalline material grains may not allow the material defect to grow and/or spread through the protective coating.

These and other embodiments are discussed below with reference to FIGS. 1-12. However, those skilled in the art will readily appreciate that the detailed description given herein with respect to these Figures is for explanatory purposes only and should not be construed as limiting.

FIG. 1 depicts an example electronic device 100. One or more external surfaces of the device 100 may include a transparent protective coating in accordance with embodiments described herein. In some implementations, the device 100 may include one or more protective covers and/or housing components that include a transparent protective coating similar to the embodiments described below with respect to FIGS. 2-12. The transparent protective coating may enhance the hardness, impact resistance, strength, and/or toughness of the protective cover without adversely or significantly impacting the optical performance or appearance of the protective cover.

As shown in FIG. 1, electronic device 100 is a portable electronic device, specifically a mobile phone. The techniques described with respect to device 100 may also be applied to other electronic devices including, for example, a notebook computer, a desktop computer, a tablet computing device, a gaming device, a display device, a digital music player, a wearable electronic device, a timekeeping device, a health monitoring device, and so on.

Electronic device 100 of FIG. 1 includes a housing 102 coupled to a display 104, one or more buttons 108, and other components of the electronic device 100. The housing 102 forms at least a portion of the exterior surface of the device 100 and may form a protective barrier or enclosure for the internal components of the electronic device 100. As shown in FIG. 1, the housing 102 at least partially surrounds the display 104 positioned within an internal cavity formed by housing 102. Housing 102 can be formed of one or more components operably connected together or, alternatively, housing 102 can be formed of a single integrated body. Housing 102 may be formed from any suitable material including metal, plastic, ceramic, and so on. In some cases the housing includes one or more portions that are formed from a transparent material such as glass, sapphire, zirconia, and the like. At least a portion of the exterior surface of the housing may include a transparent protective coating, as described in more detail below with respect to FIGS. 2-12.

In the example of FIG. 1, the device 100 also includes a protective cover 101 that is positioned over the display 104. The protective cover 101 may be formed integral with or may be coupled to housing 102 to substantially cover and protect the display 104. In the present example, the protective cover 101 may cover all or most of the front surface of electronic device 100. Because the protective cover 101 is positioned over the display 104, the optical clarity or other optical properties of the protective cover 101 may be important to the performance or appearance of the device 100. The protective cover 101 may be formed from a variety of transparent materials including glass, sapphire, zirconia, or other transparent ceramic material. In some cases, the protective cover 101 may be formed from a polymer material. The protective cover 101 may include one or more transparent protective coatings, as described in more detail below with respect to FIGS. 2-12.

As shown in FIG. 1, the device 100 also includes a display 104 that may be at least partially surrounded by housing 102 and/or may be positioned within an internal cavity formed by housing 102. The display 104 may include a display element, including, but not limited to, a liquid crystal display (LCD) element, light emitting diode (LED) element, organic light-emitting display (OLED) element, organic electroluminescence (OEL) element, or another type of display technology. The display 104 may also be integrated with or coupled to a touch sensor, such as a multi-touch sensing array that is configured to detect the presence and location of a touch proximate to the display 104 (e.g., on the surface of the protective cover 101).

As shown in FIG. 1, the device 100 may include one or more buttons or other components integrated with or installed within the housing 102. In the present example, the button 108 may function as a home button, which may be implemented as a mechanical button or a soft button (e.g., a button that does not physically move but still accepts inputs). The button 108 may include an icon or image formed using a decorative coating, light-emitting component, or a display. In some implementations, the button 108 can be integrated as part of the protective cover 101 of the electronic device 100. In other implementations, the button 108 may have a separate protective cover. Button 108 may be formed from any suitable material including polymer, metal, non-metal, ceramic, and the like. The button 108 or a protective cover for the button may include one or more transparent protective coatings, as described in more detail below with respect to FIGS. 2-12.

Although discussed herein as being transparent layers, the various layers forming the multilayer transparent protective coating may not be required to be transparent. As discussed with respect to FIG. 1, a multilayer transparent protective coating may be utilized to protect a protective cover 101 positioned over a display 104. Therefore, it may be beneficial that the transparent protective coating have a high degree of optical clarity and be free from visual artifacts. By forming crystalline structures that are less than 10 nm in size, the optical clarity of the underlying substrate may not be impaired or significantly affected. However, the same or similar techniques discussed below with respect to FIGS. 2-12 may be used to form non-transparent protective coatings over non-transparent or opaque components. For example, a multilayer or crystalline protective coating may be formed over portions of the housing 102, the button 108, or a non-transparent component that forms an exterior surface of the device 100.

FIGS. 2-7 and 9-11 depict example cross-sectional views along section A-A of FIG. 1 The cross-sectional views represent a transparent protective coating formed on a substrate or base material. In the following examples, the transparent protective coating is formed on a substrate that may correspond to the protective cover 101 (e.g. a cover glass) of the device 100. However, the layers and example embodiments of FIGS. 2-7 and 9-11 may be applied to other external surfaces of the electronic device 100 including, for example, the housing 102, button 108, and/or another protective cover of the device 100.

Figure 2:
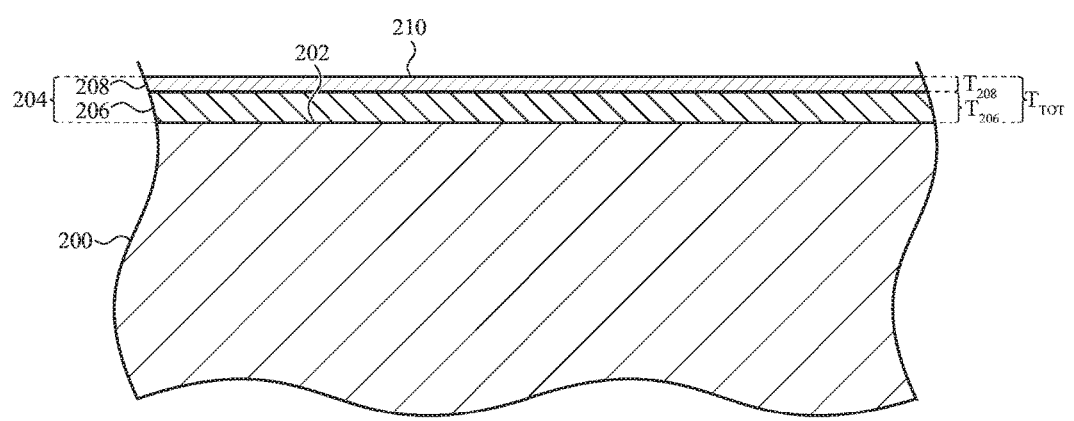
FIG. 2 shows a cross-sectional view of a substrate and a multilayer transparent protective coating.

FIG. 2 shows a cross-sectional view of a multilayer transparent protective coating formed on a substrate along section A-A of FIG. 1. In the non-limiting example of FIG. 2, a first surface 202 of substrate 200 may be covered by multilayer transparent protective coating 204, as discussed herein. Substrate 200 may be formed from any suitable material that may be substantially rigid and may withstand normal wear-and-tear inflicted on the electronic device utilizing substrate 200 as an external component. In non-limiting examples, substrate 200 may be formed from a variety of metal or ceramic materials. As discussed herein, substrate 200 may be formed from a substantially transparent material including, for example, glass, zirconia, and aluminum oxide sometimes referred to as "alumina" and "sapphire." The substrate 200 may be used to form the protective cover 101 described above with respect to FIG. 1.

Figure 7:
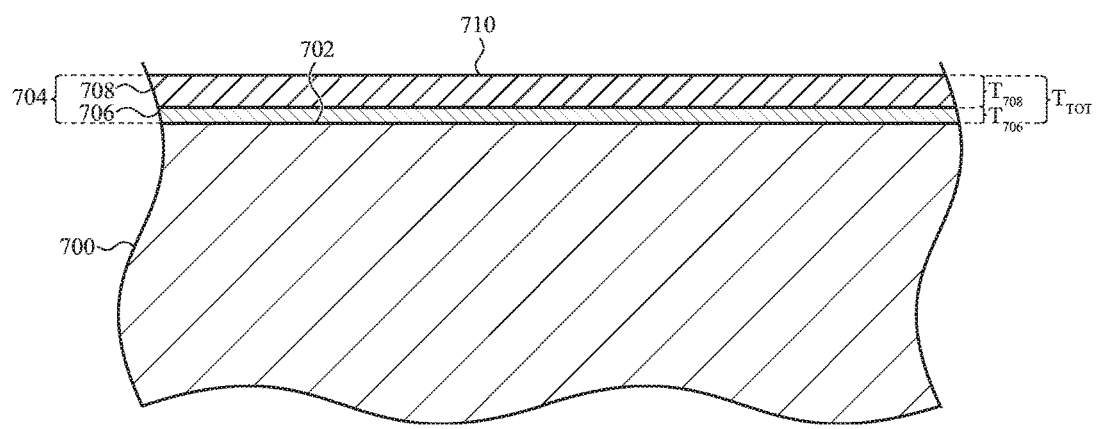
FIG. 7 shows a cross-sectional view of a substrate and a multilayer transparent protective coating.

As shown in FIG. 2, multilayer transparent protective coating 204 may be formed on first surface 202 of substrate 200. In a non-limiting example, multilayer transparent protective coating 204 may be formed over first surface 202 of substrate 200 to substantially protect substrate 200 from surface defects forming on first surface 202 and/or within substrate 200. Multilayer transparent protective coating 204 includes a group of transparent layers formed over first surface 202 and/or above substrate 200. In this example, a first transparent layer 206 is positioned below a second transparent layer 208, which may be formed from a thin crystalline (e.g., nano-crystalline) material. This is provided as one example and in an alternative embodiment, the first transparent layer 206 may be formed over the second (crystalline) transparent layer 208. FIG. 7, described below, explicitly depicts this arrangement.

As shown in FIG. 2, multilayer transparent protective coating 204 may include a first transparent layer 206 disposed directly over first surface 202 of substrate 200. First transparent layer 206 may be formed from a non-crystalline or amorphous material. In some instances, the first transparent layer 206 includes a non-crystalline material that may be more elastic or compliant than the overlaying second transparent layer 208. The first transparent layer 206 may be formed from a substantially transparent material, such that substrate 200 may be clearly visible through first transparent layer 206. In a non-limiting example, first transparent layer 206 of multilayer transparent protective coating 204 may be formed from an amorphous film. In another non-limiting example, first transparent layer 206 of multilayer transparent protective coating 204 may be formed from a polymer. As discussed herein, first transparent layer 206 may prevent and/or minimize the risk of a surface defect being formed on substrate 200.

First transparent layer 206 of multilayer transparent protective coating 204 may be disposed over first surface 202 of substrate 200 using a variety of suitable deposition techniques. Non-limiting example processes for disposing and/or depositing first transparent layer 206 on first surface 202 of substrate 200 may include physical vapor deposition (PVD), chemical vapor deposition (CVD), sputtering and/or atomic layer deposition (ALD). The specific deposition technique of first transparent layer 206 may be dependent on a number of characteristics or factors relating to multilayer transparent protective coating 204 and/or substrate 200 including, but not limited to, the material composition of the non-crystalline material forming first transparent layer 206, the thickness ($T_{206}$) of first transparent layer 206, the number of layers forming multilayer transparent protective coating 204, the material composition of substrate 200, a total thickness ($T_{TOT}$) of multilayer transparent protective coating 204 and so on.

First transparent layer 206 and additional layers of multilayer transparent protective coating 204 discussed herein may be selectively disposed or deposited over only portions of first surface 202 of substrate 200. That is, first transparent layer 206 may be selectively deposited over first surface 202 of substrate 200 using a mask or a masking technique in order to prevent first transparent layer 206 from being deposited or disposed over certain portions of first surface 202 of substrate 200.

As shown in FIG. 2, multilayer transparent protective coating 204 may also include a second transparent layer 208 disposed over first transparent layer 206. Second transparent layer 208 may be positioned above substrate 200 and may be separated from substrate 200 by first transparent layer 206. First transparent layer 206 may be an intermediate layer between second transparent layer 208 and substrate 200, and may substantially couple or bond second transparent layer 208 to substrate 200. As discussed herein, second transparent layer 208 may provide rigid structure to multilayer transparent protective coating 204 that may prevent surface defects to additional layers of multilayer transparent protective coating 204 and/or substrate 200 by absorbing and/or withstanding impact.

Second transparent layer 208 of multilayer transparent protective coating 204 may be formed from a crystalline material. In a non-limiting example, second transparent layer 208, as shown in FIG. 2, may be formed from a nano-crystalline material. As previously discussed, nano-crystal structures may have a size that prevents or mitigates the risk that a crack, defect, or other discontinuity can develop and grow into a size large enough to cause a failure of the component. Additionally, in some cases, the crystal size of the crystalline or nano-crystalline material may be below a predetermined limit to prevent the crystals from interfering or degrading the optical performance of the substrate 200. By way of example, the crystalline material forming second transparent layer 208 may have a size sufficiently small so as to be transparent or visually imperceptible to a user viewing multilayer transparent protecting coating 204. By using nano-crystalline material in multilayer transparent protective coating 204, the multilayer transparent protective coating 204 may be substantially free of a haze, cloud, or other optical artifact. This may be particularly beneficial for forming the multilayer transparent protective coating 204 on components that are positioned over a display or other visual output device.

The thickness ($T_{208}$) of the second transparent layer 208 may be limited to prevent the crystal size of the second transparent layer 208 from exceeding a size that may result in an optical artifact or otherwise affect the optical properties of the underlying substrate 200. In some cases, the thickness ($T_{208}$) of the second transparent layer 208 is limited to less than 50 nanometers. In some cases, the thickness ($T_{208}$) of the second transparent layer 208 is limited to less than 10 nanometers. In some cases, the thickness ($T_{208}$) of the second transparent layer 208 is limited to less than 5 nanometers. In one embodiment, the thickness ($T_{208}$) of second transparent layer 208 may be between approximately 2 nm and approximately 6 nm. As shown in FIG. 2, the thickness ($T_{206}$) of first transparent layer 206 may be greater than the thickness ($T_{208}$) of second transparent layer 208. In a non-limiting example, the total thickness ($T_{TOT}$) of multilayer transparent protective coating 204 may be between approximately 10 nanometers and approximately 250 nanometers. In some cases, the total thickness ($T_{TOT}$) is less than 5 microns.

Additional properties and/or characteristics of multilayer transparent protective coating 204 that may affect or determine the thickness ($T_{208}$) of second transparent layer 208 and/or other layers formed from crystalline material may include, but are not limited to, the number of layers of material utilized to form multilayer transparent protective coating 204, the material used to form the layers of multilayer transparent protective coating 204, the total thickness ($T_{TOT}$) of multilayer transparent protective coating 204 and so on.

The crystalline material used to form second transparent layer 208 of multilayer transparent protective coating 204 may include, but is not limited to, silicon dioxide, aluminum nitride, aluminum oxide, magnesium fluoride, titanium dioxide and other suitable materials having similar material properties and/or characteristics. Second transparent layer 208 may be deposited on and/or disposed over first transparent layer 206 using any material deposition technique discussed herein. Non-limiting example processes for forming the second transparent layer 208 may include physical vapor deposition (PVD), chemical vapor deposition (CVD), sputtering and/or atomic layer deposition (ALD).

As shown in FIG. 2, second transparent layer 208 may form exterior surface 210 of multilayer transparent protective coating 204. In some cases, the second transparent layer 208 may be covered by one or more additional layers or may be positioned under the first transparent layer 206. Regardless, the second transparent layer 208 may form a protective barrier to prevent scratches or other types of physical damage from affecting the underlying substrate 200. In some cases, the polycrystalline structures of the second transparent layer 208 may enhance the hardness of the transparent protective coating 204. Additionally or alternatively, the polycrystalline structures of the second transparent layer 208 may enhance the toughness and/or impact resistance of the transparent protective coating 204 by reducing the propagation of surface defects or cracks. In some cases, the combination of the first transparent layer 206 and the second transparent layer 208 may further enhance the toughness and/or impact resistance of the transparent protective coating 204. For example, the two layers may dissipate or absorb stress due to an impact or shock. The interface between the first transparent layer 206 and the second transparent layer 208 may also prevent or reduce the propagation of defects or cracks that may otherwise result in a failure of the underlying substrate 200.

Figure 3:
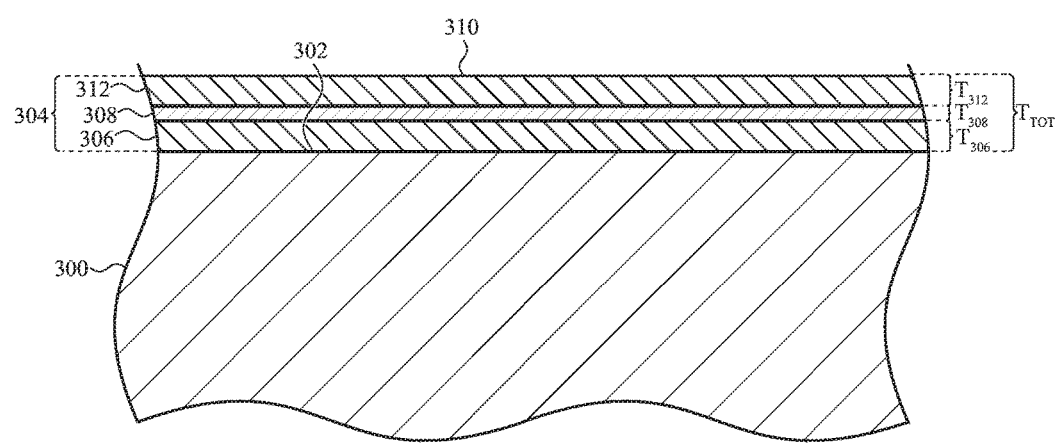
FIG. 3 shows a cross-sectional view of a substrate and a multilayer transparent protective coating.
Figure 4:
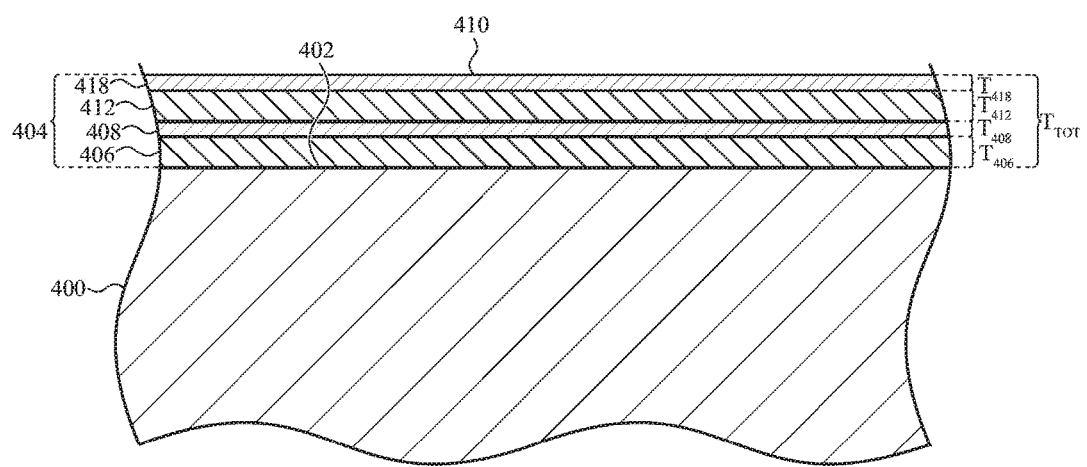
FIG. 4 shows a cross-sectional view of a substrate and a multilayer transparent protective coating.
Figure 5:
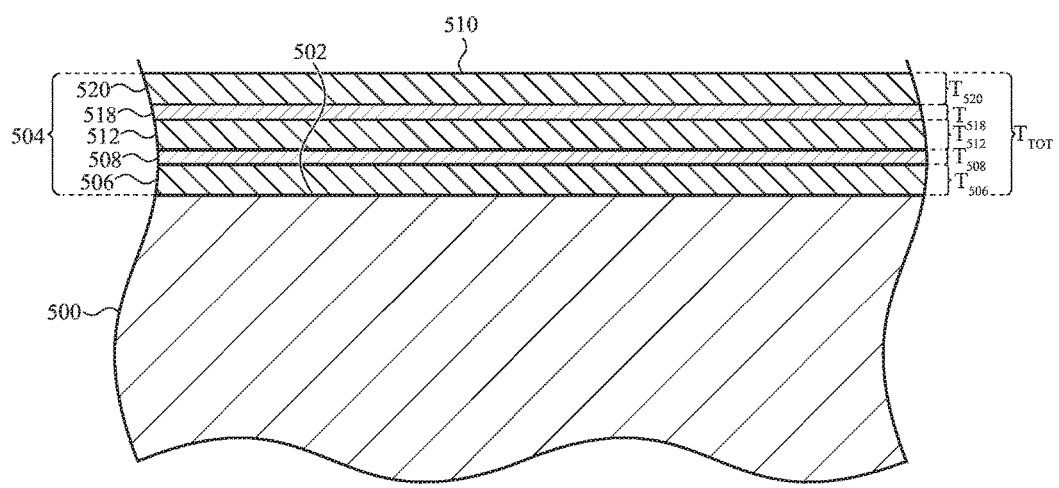
FIG. 5 shows a cross-sectional view of a substrate and a multilayer transparent protective coating.

FIGS. 3-5 show additional cross-sectional views of a multilayer transparent protective coating being formed over a substrate. In FIGS. 3-5, the multilayer transparent protective coating shown includes at least one additional transparent layer disposed over the second transparent layer discussed herein with respect to FIG. 2. The at least one additional transparent layer may be formed from either a non-crystalline material or a crystalline material, as discussed herein. It is understood that similarly numbered and/or named components may function in a substantially similar fashion. Redundant explanation of these components has been omitted for clarity.

FIG. 3 shows multilayer transparent protective coating 304 formed over substrate 300 (e.g., at first surface 302). Similar to FIG. 2, multilayer transparent protective coating 304 includes first transparent layer 306 and second transparent layer 308. Additionally, multilayer transparent protective coating 304, as shown in FIG. 3, includes a third transparent layer 312 disposed over second transparent layer 308. Third transparent layer 312 may be formed from a non-crystalline material. Third transparent layer 312 may be formed from a similar non-crystalline or amorphous material as first transparent layer 306. In a non-limiting example, both first transparent layer 306 and third transparent layer 312 may be formed from a non-crystalline material such as a polymer film or other amorphous material. Alternatively, third transparent layer 312 may be formed from non-crystalline material distinct from the material of first transparent layer 306. In the alternative, non-limiting example, first transparent layer 306 may be formed from an amorphous film, and third transparent layer 312 may be formed from a polymer material, or vice versa. Third transparent layer 312 may be deposited on and/or disposed over second transparent layer 308 using similar technique(s) discussed herein with respect to first transparent layer 206 of FIG. 2.

As shown in FIG. 3, third transparent layer 312 of multilayer transparent protective coating 304 may have a thickness ($T_{312}$). In a non-limiting example, thickness ($T_{312}$) of third transparent layer 312 may be substantially similar to the thickness of other, distinct layers of multilayer transparent protective coating 304 that are formed from non-crystalline material. As shown in FIG. 3, thickness ($T_{312}$) of third transparent layer 312 may be substantially similar to the thickness ($T_{306}$) of first transparent layer 306. In another non-limiting example, thickness ($T_{312}$) of third transparent layer 312 may be different from the thickness of the various layers forming multilayer transparent protective coating 304.

As similarly discussed herein with respect to FIG. 2, the thickness ($T_{308}$) of second transparent layer 308 may be limited in order to control the size of the polycrystalline structure of the second transparent layer 308. Similar to as discussed above with respect to the previous example, the thickness ($T_{308}$) of the second transparent layer 308 may be limited to prevent the crystal size of the second transparent layer 308 from exceeding a size that may result in an optical artifact or otherwise affect the optical properties of the underlying substrate 300. In some cases, the thickness ($T_{308}$) of the second transparent layer 308 is limited to less than 50 nanometers. In some cases, the thickness ($T_{308}$) of the second transparent layer 308 is limited to less than 10 nanometers. In some cases, the thickness ($T_{308}$) of the second transparent layer 308 is limited to less than 5 nanometers. In one embodiment, the thickness ($T_{308}$) of second transparent layer 308 may be between approximately 2 nm and approximately 6 nm. As shown in FIG. 3, the thickness ($T_{306}$) of the first transparent layer 306 and/or the thickness ($T_{312}$) of the third transparent layer 312 may be greater than the thickness ($T_{308}$) of second transparent layer 308. In a non-limiting example, the total thickness ($T_{TOT}$) of multilayer transparent protective coating 204 may be between approximately 30 nanometers and approximately 500 nanometers. In some cases, the total thickness ($T_{TOT}$) is less than 5 microns.

As shown in FIG. 3, third transparent layer 312 may form exterior surface 310. As a result, third transparent layer 312 may be exposed and may be the first portion of multilayer transparent protective coating 304 subject to an external force or impact when an associated device or component experiences an impact or other shock. The third transparent layer 312 may be susceptible to surface defects (e.g., chips, tears, slits and so on) over time and/or many shock events. Although these defects formed on third transparent layer 312 may be distinct from the defects formed on a transparent layer of crystalline material (see, FIG. 2), third transparent layer 312 may protect distinct layers of multilayer transparent protective coating 304 and/or substrate 300 in a similar manner as discussed herein with respect to second transparent layer 208 of FIG. 2. Additionally, because of the specific material characteristics and/or properties (e.g., hardness or compressibility of non-crystalline material and crystalline material) of the non-crystalline material forming third transparent layer 312 and the crystalline material forming second transparent layer 308, any surface defect experienced by third transparent layer 312 may not propagate to remaining layers of the multilayer transparent protective coating 304 or the underlying substrate 300.

Additionally, and as briefly discussed herein with respect to FIG. 2, the layers formed from non-crystalline material (e.g., first transparent layer 306, third transparent layer 312) that surround the layers formed from crystalline material (e.g., second transparent layer 308) may provide boundaries or borders to prevent the surface defect from spreading into distinct layers and/or spreading within the crystalline material. In a non-limiting example where a surface defect (e.g., crack) is formed in second transparent layer 308 formed from crystalline material, first transparent layer 306 and third transparent layer 312 formed from a non-crystalline material may substantially surround and prevent the surface defect from spreading to either layer and/or substrate 300. This prevention of spreading and/or growing of the surface defect may ensure that the surface defect formed in second transparent layer 308 does not grow to a critical failure size.

FIG. 4 shows multilayer transparent protective coating 404 formed over substrate 400 (e.g., at first surface 402). In the example of FIG. 4, the transparent protective coating 404 includes a series of transparent nano-crystalline layers 408, 418 formed over a surface of the transparent substrate 400. Multiple additional transparent layers 412, 406 are interspersed with the series of transparent nano-crystalline layers 408, 418. While only two nano-crystalline layers 408, 418 are depicted, embodiments may include more than two nano-crystalline layers interspersed with multiple additional transparent layers. In some cases, more than 5 nano-crystalline layers are interspersed with additional transparent layers.

Similar to FIG. 3, multilayer transparent protective coating 404 includes first transparent layer 406, second transparent layer 408, and third transparent layer 412. Additionally, multilayer transparent protective coating 404, as shown in FIG. 4, includes a fourth transparent layer 418 disposed over third transparent layer 412 to form exterior surface 410 of multilayer exterior surface 410. In this example, the fourth transparent layer 418 is formed from a crystalline (e.g., nano-crystalline) material. Fourth transparent layer 418 forming exterior surface 410 of multilayer transparent protective coating 404, as shown in FIG. 4, may operate and/or function in a similar fashion as second transparent layer 208 discussed herein with respect to FIG. 2. Redundant explanation of the layers and their functions has been omitted.

Likewise, the various layers 406, 408, 412, 418 may each have thicknesses $T_{406}$, $T_{408}$, $T_{412}$, $T_{418}$, respectively. Similar to the previous examples, the thicknesses $T_{408}$ and $T_{412}$ of the second transparent layer 408 and the fourth transparent layer 418 may be controlled to maintain a crystalline size below a limit that may affect or degrade the optical performance of the component or underlying substrate 400. In particular, the thicknesses $T_{408}$ and $T_{412}$ may be less than 50 nanometers, less than 10 nanometers, or less than 5 nanometers, depending on the embodiment. In some cases, the thicknesses $T_{408}$ and $T_{412}$ may range between 3 and 6 nanometers.

FIG. 5 shows multilayer transparent protective coating 504 formed over substrate 500 (e.g., at first surface 502). In the example of FIG. 5, the multilayer transparent protective coating 504 includes a series of transparent nano-crystalline layers 508, 518 formed over a surface of the substrate 500. An additional transparent layer 512 is interposed between the transparent nano-crystalline layers 508, 518. While only two nano-crystalline layers 508, 518 are depicted, embodiments may include more than two nano-crystalline layers interspersed with multiple additional transparent layers. In some cases, more than 5 nano-crystalline layers are interspersed with additional transparent layers.

Multilayer transparent protective coating 504 includes first transparent layer 506 (having thickness $T_{506}$), second transparent layer 508 (having thickness $T_{508}$), third transparent layer 512 (having thickness $T_{512}$, and fourth transparent layer 518 (having thickness $T_{518}$). Additionally, multilayer transparent protective coating 504, as shown in FIG. 5, includes a fifth transparent layer 520 (having thickness $T_{520}$) disposed over fourth transparent layer 518. Fifth transparent layer 520 may be formed from a non-crystalline material. Additionally, as shown in FIG. 5, fifth transparent layer 520 may form exterior surface 510 of multilayer transparent protective coating 504. Fifth transparent layer 520 forming exterior surface 510 of multilayer transparent protective coating 504, as shown in FIG. 5, may operate and/or function in a similar fashion as third transparent layer 318 discussed herein with respect to FIG. 3. Redundant explanation of the layers and their functions has been omitted.

Similar to the previous examples, the thicknesses $T_{508}$ and $T_{512}$ of the second transparent layer 508 and the fourth transparent layer 512 may be controlled to maintain a crystalline size below a limit that may affect or degrade the optical performance of the component or underlying substrate 500. In particular, the thicknesses $T_{508}$ and $T_{512}$ may be less than 50 nanometers, less than 10 nanometers, or less than 5 nanometers, depending on the embodiment. In some cases, the thicknesses $T_{508}$ and $T_{512}$ may range between 3 and 6 nanometers.

In the embodiments described above with respect to FIGS. 2-5, the various layers may have a similar optical index or be otherwise optically matched to minimize or reduce optical artifacts due to the protective coating. In some cases, the layers have an index of refraction that is substantially the same or matched. This is in contrast to multi-layer coatings that may be intentionally mismatched to produce a particular optical effect like reducing reflected light. Additionally, as discussed above, the size the nano-crystalline structures and thinness of the layers may also be adapted to reduce or minimize optical artifacts.

While the protective coatings described above with respect to FIGS. 2-5 above may not inherently produce an optical effect, the layers may be combined with other layers that are adapted to produce an optical effect. In particular, the layers of the protective coatings may be interspersed with one or more layers that are configured to produce an anti-reflective optical effect.

Figure 6:
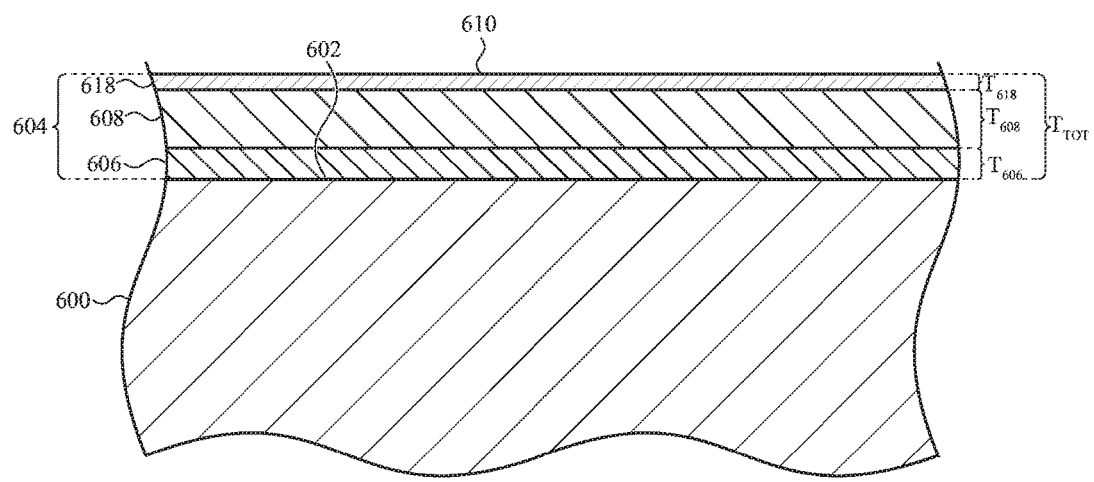
FIG. 6 shows a cross-sectional view of a substrate and a multilayer transparent protective coating including an anti-reflective (AR) coating.

FIG. 6 shows multilayer transparent protective coating 604 formed over substrate 600 and an anti-reflective (AR) layer or coating. As similarly discussed herein with respect to FIGS. 2-5, multilayer transparent protective coating 604 may include a (non-crystalline) first transparent layer 606 (having thickness $T_{608}$) and a (nano-crystalline) second transparent layer 618 (having thickness $T_{618}$ and forming exterior surface 610). However, unlike the embodiments shown in FIGS. 2-5, multilayer transparent protective coating 604 may also include an anti-reflective (AR) layer 608 (having thickness $T_{608}1$ or coating positioned within the protective coating 604 and having a thickness $T_{622}$. AR layer 608 may be formed over first transparent layer 606 to prevent and/or reduce reflection through multilayer transparent protective coating 604 and/or on substrate 600. AR layer 608 may be formed from any suitable material that may provide anti-reflective properties to multilayer transparent protective layer 604 and/or on substrate 600. For example, AR layer 608 may have an index of refraction that is different than the other layers in the multilayer transparent protective coating 604 and/or the underlying substrate 600. Additionally, and as similarly discussed herein with respect to FIGS. 2-5, AR layer 608 may also function as a protective layer to protect first surface 602 and/or substrate 600 from surface defects. As with other embodiments, the thickness of the nano-crystalline second transparent layer 618 may be controlled to limit the size of the crystals and reduce optical artifacts caused by the second transparent layer 618.

Although AR layer 608 is shown as being positioned on first transparent layer 606, the AR layer 608 may be formed in a variety of positions within multilayer transparent protective coating 604. In non-limiting examples, AR layer 608 may be formed directly on substrate 600, first transparent layer 606 and/or second transparent layer 618. Additionally, where multilayer transparent protective layer 604 includes additional transparent layers, as discussed herein with respect to FIGS. 3-5, AR layer 608 may be formed directly on and/or between at least some of the additional layers as well.

In this simplified example, the AR layer 608 is depicted as a single homogenous layer. However, in some implementations, the AR layer 608 is formed from multiple layers, each layer having a different index of refraction than an adjacent or neighboring layer. If the AR layer 608 is formed from multiple layers, those layers may be positioned adjacent to each other or, alternatively, may be interspersed with and separated by the other layers in the protective coating 604.

FIG. 7 shows multilayer transparent protective coating 704 formed over substrate 700 (e.g., at first surface 702). As similarly discussed herein with respect to FIGS. 2-6, multilayer transparent protective coating 704 may include at least one transparent layer formed from crystalline material and at least one transparent layer formed from non-crystalline material. However, the materials forming the distinct layers of multilayer transparent protective coating 704 may be switched when compared to the embodiments discussed with respect to FIGS. 2-6. In the non-limiting example shown in FIG. 7, first transparent layer 706 may be formed from a crystalline (e.g., nano-crystalline) material, and second transparent layer 708 (forming an exterior surface 710) may be formed from a non-crystalline material.

Each of first transparent layer 706 and second transparent layer 708 may include similar properties or attributes (e.g., thickness, material composition and so on) and may function and/or operate in a similar manner as the previously discussed, corresponding layers of multilayer transparent protective coating formed from similar material, as discussed herein with respect to FIGS. 2-6. That is, first transparent layer 706 may be formed from crystalline material and is substantially similar in material composition, thickness ($T_{706}$) and/or function as second transparent layer 308 of FIG. 3. Likewise, second transparent layer 708 may be formed from non-crystalline material and is substantially similar in material composition, thickness ($T_{708}$) and/or function as third transparent layer 412 of FIG. 4. Redundant explanation of these components has been omitted.

The number of transparent layers, their positioning, thicknesses and/or formation are given as examples only. More or fewer layers may be used in different embodiments. For example, the multilayer transparent protective coating may be formed from more than five distinct layers of alternating crystalline and non-crystalline material. In some cases, the transparent protective coating is formed from up to twenty distinct transparent layers of crystalline and non-crystalline material. Likewise, alternation of the crystalline and non-crystalline layers is an example and not a limitation. Thus, multiple layers of non-crystalline material may be deposited or disposed over one another to form a protective coating. The exact number of layers and the composition of any give layer (e.g., crystalline vs. non-crystalline) may vary between embodiments.

Figure 8:
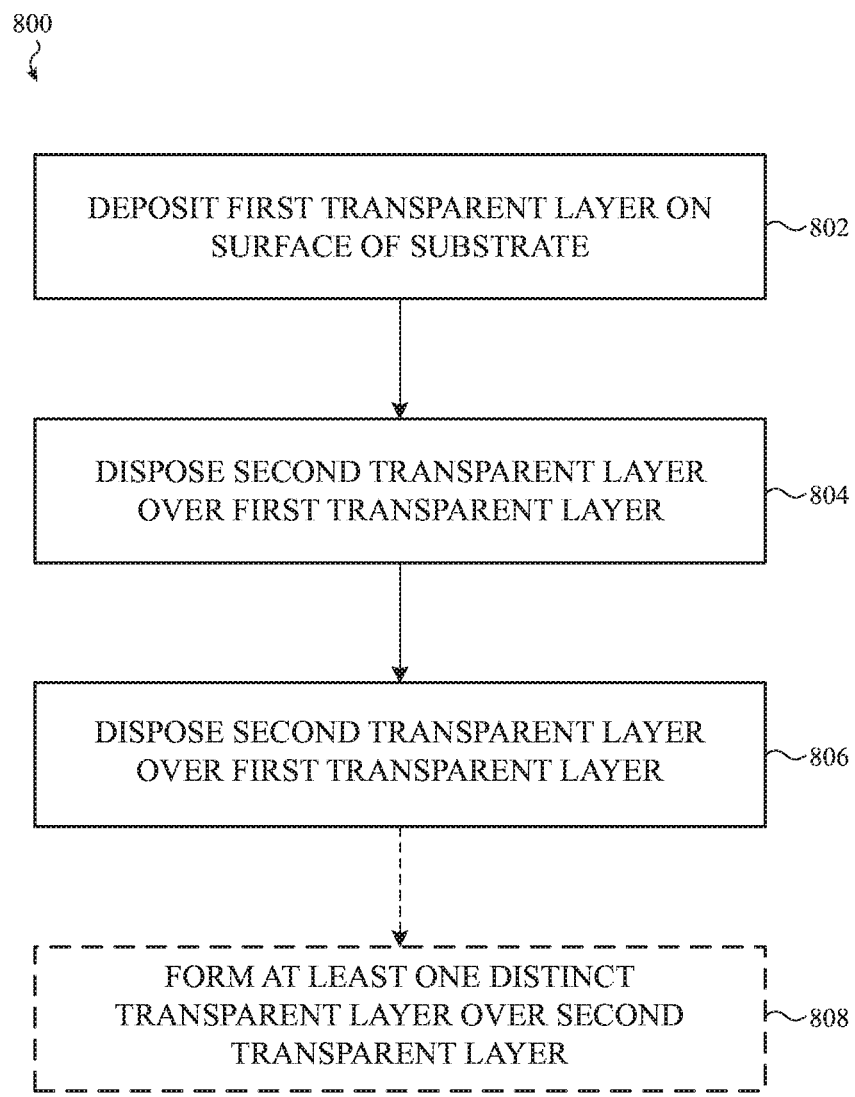
FIG. 8 shows a flow chart of an example process for forming a multilayer transparent protective coating on a substrate.

FIG. 8 depicts an example process 800 for forming a multilayer transparent protective coating on a substrate. This process may be used to form one of the various embodiments as discussed above with respect to FIGS. 2-7.

In operation 802, a first transparent layer may be deposited on a first surface of a substrate. The first transparent layer deposited on the first surface of the substrate may be formed from a non-crystalline material and may have a first thickness. The first transparent layer may be formed by one or more of a variety of material deposition techniques. Sample techniques include a physical vapor deposition (PVD) process, a chemical vapor deposition (CVD) process, a sputtering process and/or an atomic layer deposition (ALD) process.

Additionally, the depositing of the first transparent layer formed from the non-crystalline material may include masking a portion of the first surface of the substrate. Masking a portion of the first surface of the substrate may allow for selective deposition of the first transparent layer on the first surface of the substrate. In some implementations, the protective coating may only be applied to regions of the component that are most susceptible to damage and omitted from regions where optical clarity or optical performance is critical. In one example implementation, the protective coating may be formed around the perimeter of a protective cover and not over a central portion that is used to view an underlying display or other visual component.

In operation 804, a thickness of a second transparent layer formed from a crystalline material may be calculated. The thickness of the second transparent layer may be controlled to limit the size of the crystalline structures formed within the second transparent layer. Controlling the size of the crystals may improve the durability of the coating by preventing or reducing the propagation of defects or discontinuities (e.g., cracks) through the material. The size of the crystals may also be maintained below a limit to reduce or eliminate optical artifacts of the crystal layer. In particular, nano-crystals having a size of less than 10 nanometers (in some cases between 2 and 6 nanometers) may not degrade the optical clarity of the coating. In some cases, use of nano-crystals within the protective coating is not optically perceptible or detectable by the naked human eye.

In some embodiments, the thickness of the second transparent layer may be less than 10 nanometers. In some cases, the thickness of the second transparent layer may range between 2 nanometers and 6 nanometers. The thickness of the second transparent layer may be significantly less than the thickness of the first transparent layer formed in operation 802. Additionally, the total threshold thickness for both the first transparent layer and the second transparent layer may be from 10 nm to 250 nm, in some embodiments. In some cases, the total thickness is less than 5 microns. Operation 804 may also include determining a crystal size of the crystalline material forming the second transparent layer. The determined crystal size may be below a limit for optical degradation of the crystalline material.

The second transparent layer may be formed by one or more of a variety of material deposition techniques. Sample techniques include a physical vapor deposition (PVD) process, a chemical vapor deposition (CVD) process, a sputtering process and/or an atomic layer deposition (ALD) process. Additionally, the depositing of the second transparent layer formed from the crystalline material may include masking a surface or region to allow for selective deposition of the second transparent layer. As discussed above, in some implementations, the protective coating may only be applied to regions of the component that are most susceptible to damage and omitted from regions where optical clarity or optical performance is critical.

In operation 806, the second transparent layer may be disposed over the first transparent layer. The second transparent layer may have the calculated thickness calculated in operation 804. Additionally, the second transparent layer is disposed over the first transparent layer such that the total thickness of the first transparent layer and the second transparent layer may be from 10 nanometers to 5 microns, in some embodiments. The second transparent layer may be disposed over the first transparent layer using a similar technique as discussed above with respect to operation 802, or any other suitable material disposing or depositing technique.

In optional operation 808 (shown in dashed lines in FIG. 8), at least one additional or distinct transparent layer may be formed over the second transparent layer. Forming at least one distinct transparent layer may include one or more of depositing a third transparent layer over the second transparent layer, depositing a fourth transparent layer over the third transparent layer and/or depositing a fifth transparent layer over the fourth transparent layer. The third transparent layer, fourth transparent layer and fifth transparent layer may be formed from one of a non-crystalline material or a crystalline material. As one example, the third transparent layer and the fifth transparent layer may be formed from a non-crystalline material, and the fourth transparent layer may be formed from a crystalline material (or vice versa). Additionally, forming at least one distinct transparent layer may include depositing a polymer layer directly over the second transparent layer.

Although not shown, other operations may be performed on the substrate and/or the various layers forming the multilayer transparent protective coating. In a non-limiting example, an anti-reflective (AR) coating or layer may be deposited directly on one or more of the substrate and/or the layers forming the multilayer transparent protective coating. Specifically, an AR coating may be deposited on at least one of the first surface of the substrate, the first transparent layer and/or between any other transparent layers, where the protective coating includes at least three distinct transparent layers (see, FIGS. 3-5).

Figure 9A:
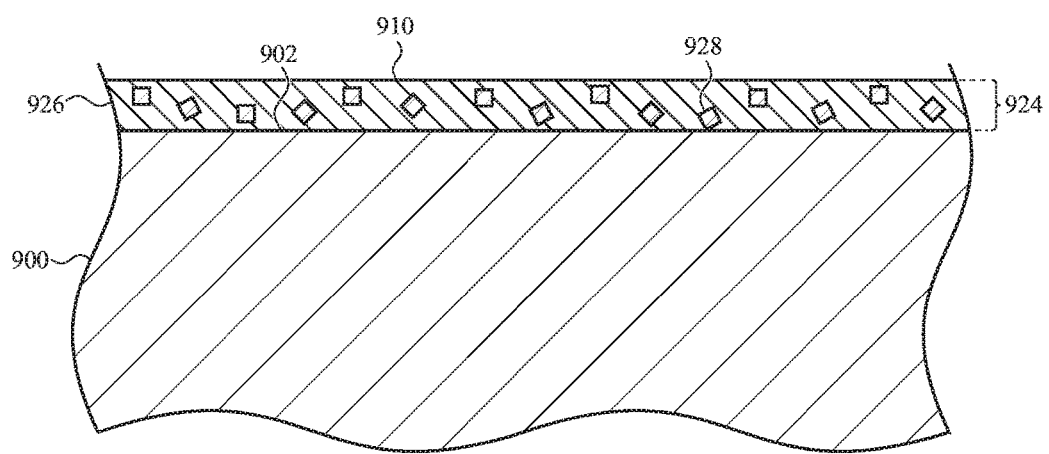
FIG. 9A shows a cross-sectional view of a substrate and a transparent protective coating.
Figure 9B:
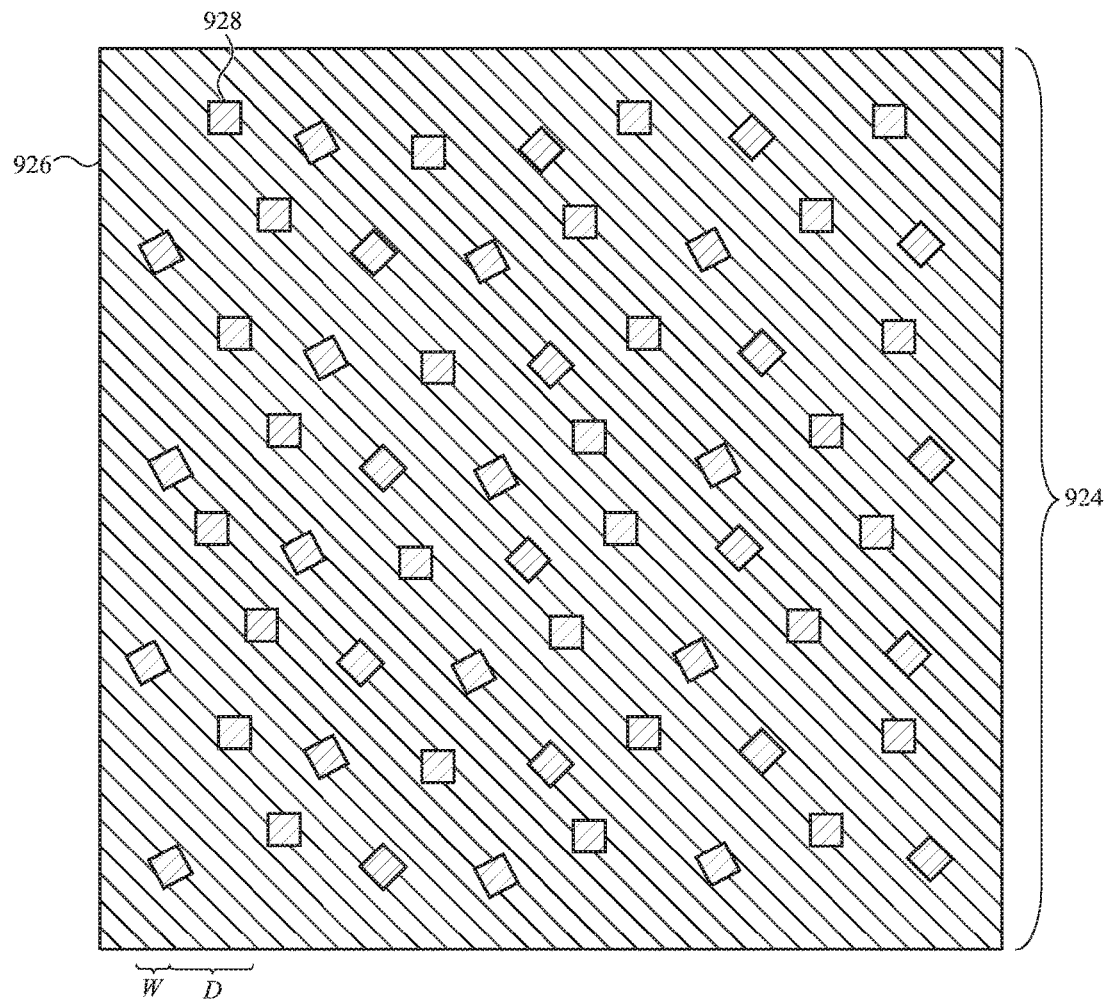
FIG. 9B shows a top view of the transparent protective coating of FIG. 9A.

FIGS. 9A and 9B show a cross-sectional and top view, respectively, of another multilayer transparent protective coating formed on a substrate, according to embodiments. As shown in FIG. 9A, transparent protective coating 924 may be formed over first surface 902 of substrate 900. Substrate 900 may be substantially similar to the substrate discussed herein with respect to FIGS. 2-7. The substrate 900 may be formed from a metal, non-metal, ceramic, or other type of material. In some cases, the substrate 900 may be formed from a transparent material such as glass, sapphire, zirconia, or other transparent material. In a non-limiting example, substrate 900 may be formed from an optically transparent sheet of glass. Further explanation of substrate 900 is omitted for clarity.

As shown in FIG. 9A, multilayer transparent protective coating 924 may include an amorphous material layer 926, which may also be referred to generally herein as an amorphous material or a matrix material. Amorphous material layer 926 may be disposed over first surface 902 of substrate 900. In a non-limiting example shown in FIGS. 9A and 9B, amorphous material layer 926 may be formed over first surface 902 of substrate 900 to form exterior surface 910 of multilayer transparent protective coating 924, and/or to protect substrate 900.

Amorphous material layer 926 may be formed from an optically transparent material such that substrate 900 may be visible through amorphous material layer 926. In a non-limiting example, amorphous material layer 926 may be formed from an oxide-based material, such as aluminum oxide. Amorphous material layer 926 may be deposited on substrate 900 using any material deposition technique discussed herein. In non-limiting examples, amorphous material layer 926 may be deposited on and/or disposed over substrate 900 using a physical vapor deposition (PVD) process, a chemical vapor deposition (CVD) process, a reactive sputtering PVD process and/or an atomic layer deposition (ALD) process. The disposing process used for amorphous material layer 926 may be dependent, at least in part, on the material composition of amorphous material layer 926, the material composition of substrate 900, the deposition temperature of amorphous material layer 926, and the subsequent processes performed on amorphous material layer 926 in forming multilayer transparent protective coating 924, as discussed below.

As shown in FIGS. 9A and 9B, a group of crystalline material grains 928 may be formed in amorphous material layer 926 to form multilayer transparent protective coating 924. As discussed in more detail with respect to FIG. 12 below, the crystalline material grains 928 may be formed using a combination of ion implantation and elevated temperature annealing. By combining ion implantation with elevated temperature annealing may allow for the formation of crystalline material grains 928 at a temperature that is low enough for processing on a glass substrate. In some cases, the kinetic energy of the implantation combined with the thermal energy provided by the annealing results in a phase segregation and agglomeration sufficient to form the crystalline material grains 928 at a temperature well below the melting temperature of glass. In some cases, the annealing temperature is at or below 900 degrees Celsius.

The crystal formation process may be adapted to produce nano-crystalline structures having a size that enhances the strength and durability of the coating without adversely affecting or impacting the optical properties. By way of example, each crystalline material grain 928 may have a width (W) of approximately 2 nanometers (nm) to approximately 12 nm. Additionally, and as shown in FIG. 9B, each crystalline material grain 928 may be separated from any adjacent crystalline material grain by a distance (D) of approximately 1 nm to approximately 5 nm.

FIGS. 9A and 9B depict simplified representations of crystalline material grains 928 having nano-crystalline structures suspended in the amorphous material layer 926 or matrix material. The simplified depiction exaggerates the relative size of the crystalline material grains 928 with respect to the protective coating 924 and simplifies the shapes of the crystalline structures as squares for clarity. In many implementations, FIGS. 9A and 9B may not be representative of the actual size and shape of the crystalline material grains 928 or the protective coating 924.

As discussed herein, the operational parameters and/or characteristics of the ion-implantation process may determine the specific material composition of each crystalline material grain 928. In non-limiting examples, crystalline material grains 928 may be single nano-crystalline structures including, but are not limited to, materials such as carbon nitride, silicon nitride, aluminum nitride and oxynitride. Additionally, each crystalline material grain 928 formed in amorphous material layer 926 may provide a desired physical, chemical and/or optical characteristic for the transparent protective coating 924. These desired physical, chemical, and/or optical characteristics may be dependent at least in part on the material composition of each crystalline material grain 928. In non-limiting examples, the characteristics may include, but are not limited to, improved strength, rigidity, and/or anti-reflective properties.

As similarly discussed above with respect to the multi-layer transparent protective coating of FIGS. 2-7, the formation, the size and/or the orientation of the crystalline material grains 928 within amorphous material layer 926 may substantially reduce or minimize negative effects of a surface defect (e.g., crack) formed in transparent protective coating 924. That is, because of the width (W) of crystalline material grains 928 and/or the separation distance (D) between each crystalline material grain 928, surface defects formed in transparent protective coating 924 may be limited in their ability to expand and/or grow within transparent protective coating 924. As a result, surface defects may be prevented from reaching and/or exceeding a critical failure dimension for transparent protective coating 924, and transparent protective coating 924 may remain functional even with minimal surface defects.

In a non-limiting example, because each crystalline material grain 928 is between 2 nm and 12 nm in size, and because amorphous material layer 926 surrounds and/or provides a boundary around crystalline material grain 928, any surface defect formed within the transparent protective coating 924 may be prevented from growing due to the small size of crystalline material grains 928. In another non-limiting example, because each crystalline material grain 928 is separated from one another by a distance (D) of 1 nm to 5 nm, a surface defect formed in the amorphous material layer 926 may be prevented from growing due to the small distance between each crystalline material grain 928 (e.g., 5 nm maximum).

There are a variety of techniques for forming the transparent protective coating 924. The transparent protective coating may be formed from an amorphous material layer 926 comprising a matrix material and an ion-implanting process used to form the crystalline material grains 928. In a non-limiting example, amorphous material layer 926 (e.g., the matrix material) may be deposited directly on first surface 902 of substrate 900. Simultaneous to or subsequent to the deposition of the amorphous material layer 926 on substrate 900, amorphous material layer 926 and substrate 900 may undergo an annealing process to produce the phase segregation necessary to form the nano-crystalline structures of the crystalline material grains 928.

In some cases, annealing temperatures may be too high for the underlying substrate 900. For example, if the substrate 900 is a glass sheet, annealing temperatures greater than 1400 degrees Celsius may melt or distort the glass sheet. In some cases, the annealing temperature can be reduced if coupled with an ion-implanting or embedding process. In some implementations, the amorphous material layer 926 or matrix material may be subjected to an ion-implantation process, which may increase the energy to a level sufficient to achieve phase segregation within the layer and facilitate the formation of the nano-crystalline structure of the crystalline material grains 928. In particular, the ion-implantation process may provide additional kinetic energy to the heated amorphous material layer 926 in order to facilitate the formation of the proper phase structure and allow agglomeration to produce nano-crystalline structures suspended within the matrix material.

The characteristics and/or properties of crystalline material grains 928 formed in amorphous material layer 926 may be dependent on the operational parameters of the ion-implantation process. In a non-limiting example, and as discussed herein, the energy level, the acceleration and/or the temperature of the ions used in the ion-implantation process may determine the physical characteristics (e.g., size, depth) of each crystalline material grains 928 formed within amorphous material layer 926. In another non-limiting example, and as discussed herein, the composition of each ion (e.g., nitrogen, silicon, aluminum), which may be implanted or embedded within amorphous material layer 926 to form crystalline material grains 928 may determine the chemical or material composition of each crystalline material grain 928.

The ion-implantation process may be performed subsequent to the annealing of amorphous material layer 926 and substrate 900, or may happen simultaneously with the annealing process. That is, as amorphous material layer 926 and substrate 900 are being annealed, the ion-implantation process for forming the group of crystalline material grains 928 may be performed, as well. This simultaneous performance of annealing and ion-implantation is referred to as "active annealing" or "hot implantation" and may aid in the ion diffusion and/or phase segregation with amorphous material layer 926 to form crystalline material grains 928.

Figure 10:
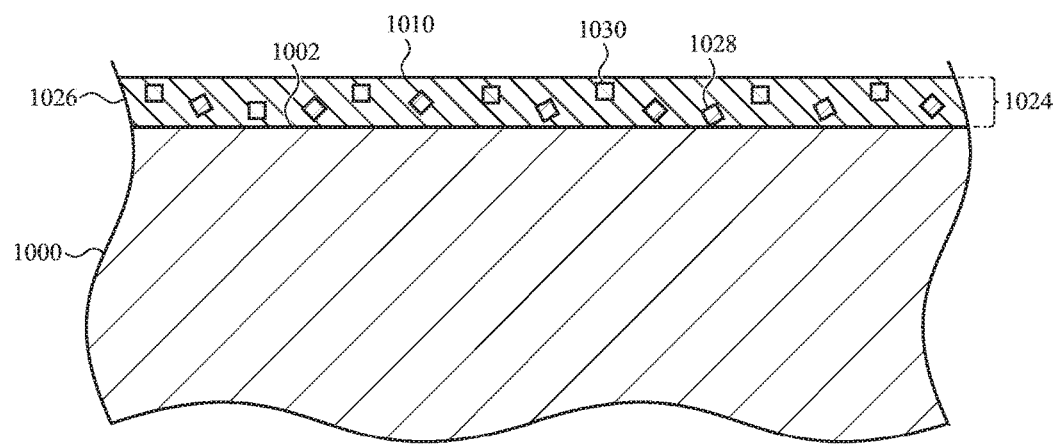
FIG. 10 shows a cross-sectional view of a substrate and a transparent protective coating.

As shown in FIG. 10, transparent protective coating 1024 may include crystalline material grains 1028, 1030 having varying compositions and formed in amorphous material layer 1026. In the example, as shown in FIG. 10, the amorphous material layer 1026 may extend from a first surface 1002 of a substrate 1000 and form an exterior surface 1010. In the non-limiting example, the group of ion-implanted crystalline material grains formed in amorphous material layer 1026 may include a first group of crystalline material grains 1028 formed in amorphous material layer 1026 and having a first composition, and a second group of crystalline material grains 1030 formed in amorphous material layer 1026, and having a second, different composition.

Each of the distinct groups of crystalline material grains 1028, 1030 may be formed using the ion-implantation process discussed herein. However, the operational parameters of the ion-implantation process may be distinct or unique for each group of crystalline material grains 1028, 1030 formed within amorphous material layer 1026. For example, the types of ions, the energy of the ions and/or the acceleration of the ions used in forming the first group of crystalline material grains 1028 may be distinct from ion parameters used in forming the second group of crystalline material grains 1030. As a result, the first group of crystalline material grains 1028 may have distinct physical, chemical and/or optical characteristics from the second group of crystalline material grains 1030.

In a non-limiting example, the first group of crystalline material grains 1028 may be formed as carbon nitride that may provide increased tensile strength within or to transparent protective coating 1024. By contrast, the second group of crystalline material grains 1030 may be formed as aluminum nitride that may provide anti-reflective characteristics to transparent protective coating 1024. Additionally, and as discussed herein, the composition of first group of crystalline material grains 1028 and second group of crystalline material grains 1030 may be dependent on the composition of the ion used, implanted and/or imbedded into amorphous material layer 1026 during the ion-implantation process. In the non-limiting example, carbon ions may be utilized to form first group of crystalline material grains 1028 as carbon nitride, and aluminum ions may be utilized to form second group of crystalline material grains 1030 as aluminum nitride.

Figure 11:
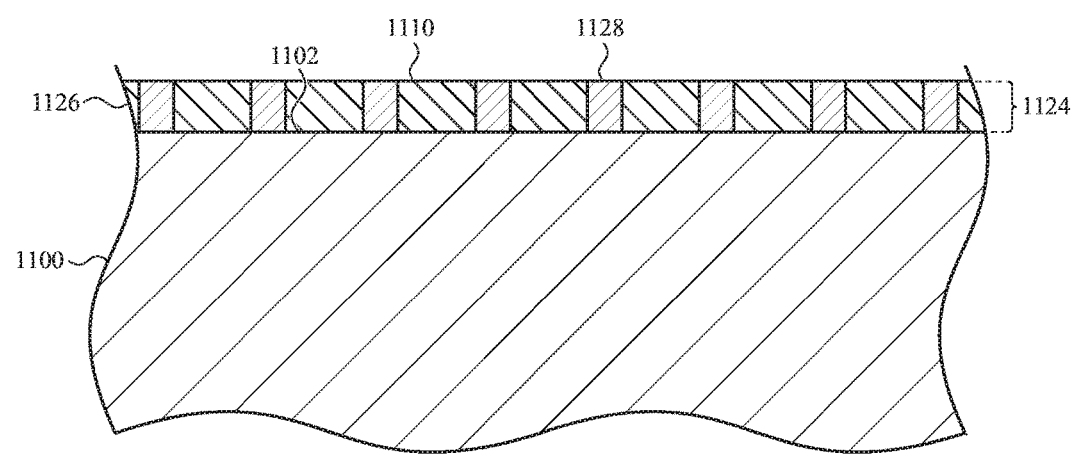
FIG. 11 shows a cross-sectional view of a substrate and a transparent protective coating.

In examples shown and discussed herein with respect to FIGS. 9A-10, the groups of crystalline material grains may be formed to extend only partially through the amorphous material layer. By contrast, transparent protective coating 1124, as shown in FIG. 11, may have groups of crystalline material grains 1128 extending completely through amorphous material layer 1126. In the example shown in FIG. 11, each crystalline material grain 1128 extends from an upper surface 1110 of transparent protective coating 1124 to a lower surface 1102 of substrate 1100.

As discussed elsewhere herein, the operational parameters of the ion-implantation process may determine how the group of crystalline material grains 1128 is formed within amorphous material layer 1126. Specifically, the types of ions, the energy of the ions and/or the acceleration of the ions used in forming the group of crystalline material grains 1128 may be altered to achieve distinct dimensions or depths for crystalline material grains 1128 within amorphous material layer 1126. In order to achieve the positioning and/or dimensions of crystalline material grains 1128 shown in FIG. 11, the ions utilized to form crystalline material grains 1128 may have a higher energy and/or may be accelerated to a greater speed than those ions used to form the crystalline material grains in the transparent protective coatings discussed in FIGS. 9A-10.

Although shown in FIGS. 9A-11 as having a uniform width (W) and space distance (D), the group of ion-implanted crystalline material grains may vary in size and/or in spacing between adjacent crystalline material grains. The uniform pattern of crystalline material grains shown in FIGS. 9A-11 are merely exemplary and are shown to be uniform for the purpose of simplicity. In a non-limiting example, the amorphous material layer may undergo an ion-implantation process where ions are accelerated toward the majority of the surface of the amorphous material layer. In the non-limiting example, crystalline material grains may be formed in the portions of the amorphous material layer that achieve and/or allow implantation of the ions. As such, the pattern of the group of ion-implanted crystalline material grains may be random and not uniform. However, based on the operational and/or compositional parameters of the ion-implantation process, each crystalline material grain may vary within the desired width (e.g., 2 nm to 12 nm) and/or separation distance (e.g., 1 nm to 5 nm) in a random formation pattern within the amorphous material layer. Accordingly, the spacing and patterns shown in FIGS. 9A-11 are illustrative and simplified for purposes of illustration.

Figure 12:
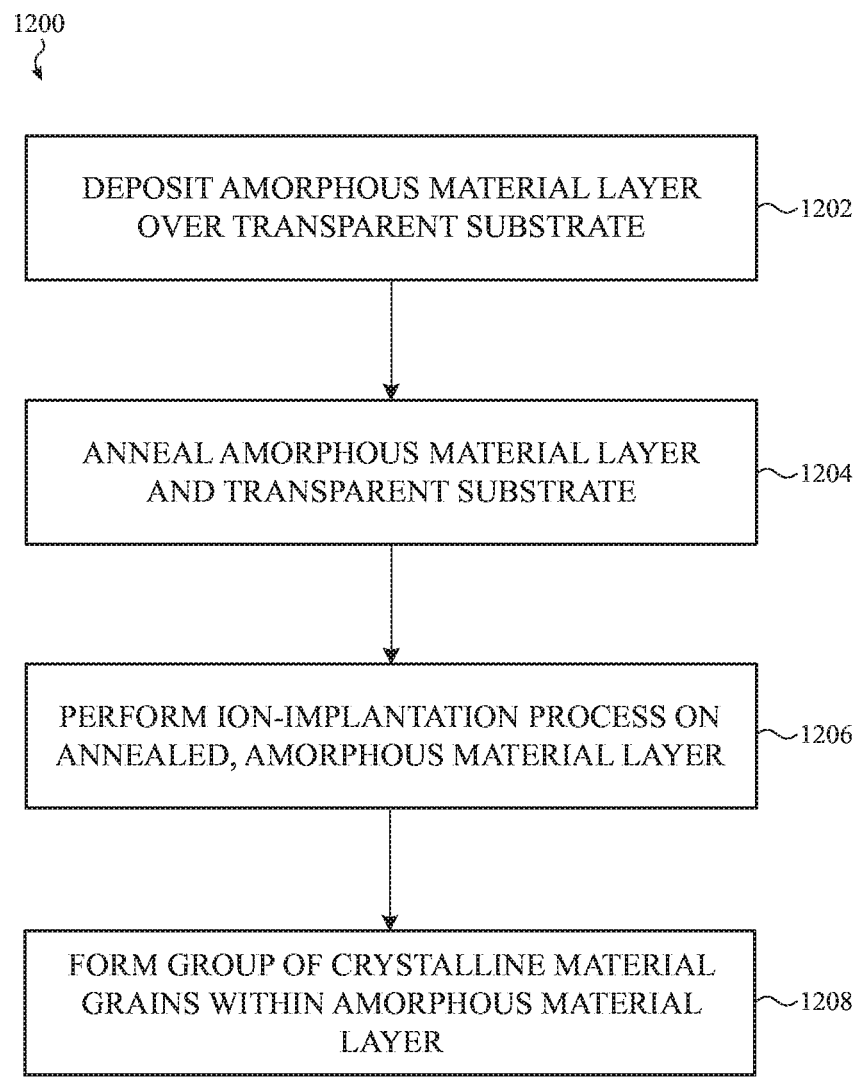
FIG. 12 shows a flow chart of an example process for forming a transparent protective coating on a substrate.

FIG. 12 depicts an example process 1200 for forming a transparent protective coating on a substrate. This process may be used to form one of the various embodiments as discussed above with respect to FIGS. 9A-11.

In operation 1202, an amorphous material layer or matrix material may be deposited over a first surface of a transparent substrate. The depositing of the amorphous material layer may include one or more of a variety of material deposition techniques. That is, the depositing the amorphous material layer may further include performing a physical vapor deposition (PVD) process on the first surface of the substrate, performing a chemical vapor deposition (CVD) process on the first surface of the substrate, performing a sputtering process on the first surface of the substrate and/or performing an atomic layer deposition (ALD) process on the first surface of the substrate. The amorphous material layer or matrix material deposited on the substrate may be optically transparent, and/or may be formed from an oxide-based material.

In operation 1204, the amorphous material layer and the transparent substrate may be annealed. The annealing of the amorphous material layer and the transparent substrate may include heating the amorphous material layer and the transparent substrate to a temperature between 100 and 900 degrees Celsius.

In operation 1206, an ion-implantation (or ion-embedding) process is performed on the annealed, amorphous material layer. The performing of the ion-implantation process on the annealed, amorphous material layer may include providing accelerated ions to the amorphous material layer to achieve ion diffusion within the amorphous material layer. The performing of the ion-implantation process on the annealed, amorphous material layer may also include providing accelerated ions to the amorphous material layer to achieve phase segregation within the amorphous material layer.

In operation 1208, and in response to performing the ion-implantation process in operation 1206, a group of crystalline material grains may form within the amorphous material layer. Specifically, as a result of the ion-implantation, the ion diffusion and/or the phase segregation achieved in the amorphous material layer in operation 1206, ion-exposed portions of the amorphous material layer may include crystalline material grains. Formation of the group of crystalline material grains in the amorphous material layer or matrix material may include forming a nano-crystalline structure or crystalline material grain at a size of less than 12 nanometers and suspended within the matrix material at a distance of between 1 and 5 nanometers apart from one another. In some cases, the nano-crystalline structures or crystalline material grains have a diameter, width or dimension of approximately 2 nanometers to approximately 5 nanometers.

Additionally, the forming of the group of crystalline material grains in the amorphous material layer may include ion-implanting a first group of crystalline material grains having a first physical, chemical and/or optical characteristic into the amorphous material layer, and ion-implanting at least one distinct group of crystalline material grains having a second physical, chemical and/or optical characteristic into the amorphous material layer. The second physical, chemical and/or optical characteristic of the at least one distinct group of crystalline material grains may be distinct from the first physical, chemical and/or optical characteristic of the first group of crystalline material grains.

Although shown in linear or consecutive order, distinct operations of the example process 1200 of FIG. 12 may be performed simultaneous to other operations. In a non-limiting example, the annealing process performed in operation 1204 may be performed simultaneous to the depositing process performed in operation 1202 and/or the ion-implantation process performed in operation 1206. In another non-limiting example, the ion-implantation process performed in operation 1206 may be performed simultaneous to the depositing process performed in operation 1202.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device comprising:
   an enclosure; and
   a protective cover coupled to the enclosure and forming an exterior surface of the electronic device, the protective cover comprising:
      a glass substrate;
      a series of transparent nano-crystalline layers formed over a surface of the glass substrate, each transparent nano-crystalline layer having a thickness of less than 10 nanometers and including nitride nano-crystals suspended in a matrix material; and
      at least one transparent layer interspersed with the series of nano-crystalline layers.

2. The electronic device of claim 1, wherein a first nano-crystalline layer of the series of transparent nano-crystalline layers includes crystals having a size of less than 6 nm.

3. The electronic device of claim 1, wherein a first nano-crystalline layer of the series of transparent nano-crystalline layers includes crystals having a size of less than 10 nm.

4. The electronic device of claim 1, wherein the at least one transparent layer is formed from a non-crystalline material.

5. The electronic device of claim 1, wherein the at least one transparent layer is formed from an amorphous material.

6. The electronic device of claim 1, wherein the at least one transparent layer is formed from a polymer material.

7. The electronic device of claim 1, wherein a first nano-crystalline layer of the series of transparent nano-crystalline layers has a layer thickness of between 2 nm and 6 nm.

8. The electronic device of claim 1, wherein:
   the series of transparent nano-crystalline layers includes at least 5 nano-crystalline layers; and
   the at least one transparent layer includes a non-crystalline layer interspersed between each of the nano-crystalline layers.

9. The electronic device of claim 8, wherein a total thickness of the series of transparent nano-crystalline layers and the interspersed transparent layers is less than 5 microns.

10. The electronic device of claim 8, further comprising an anti-reflective layer interspersed with the series of transparent nano-crystalline layers.

11. The electronic device of claim 1, wherein a matrix material of a first nano-crystalline layer of the series of transparent nano-crystalline layers is formed from a material including one or more of: silicon dioxide, aluminum nitride, aluminum oxide, magnesium fluoride, or titanium dioxide.

12. A method of forming a multilayer transparent protective coating, the method comprising:
   forming a first transparent layer on a surface of a glass substrate; and
   forming a second transparent layer over the first transparent layer, wherein:
      one of the first or second transparent layers includes a crystalline layer having a thickness of less than 10 nanometers and including nitride nano-crystals suspended in a matrix material; and
      the other of the first or second transparent layers having a thickness greater than 10 nanometers.

13. The method of claim 12, wherein forming the crystalline layer includes forming nano-crystalline structures less than 5 nanometers in size.

14. The method of claim 12, wherein the crystalline layer is formed by:
   implanting ions into a matrix material of the crystalline layer; and
   annealing the crystalline layer to form crystal structures less than 5 nanometers in size.

15. The method of claim 12, wherein the crystalline layer is formed by one or more of:
   a physical vapor deposition process;
   a chemical vapor deposition process; or
   an atomic layer deposition process.

16. The method of claim 12, wherein the other of the first or second transparent layers is formed from a non-crystalline material.

17. The method of claim 12, further comprising:
   forming at least one anti-reflective layer between the first and second transparent layers.

18. A protective cover for an electronic device comprising:
   a glass sheet; and
   a nano-crystalline layer disposed over a surface of the glass sheet and comprising:
      a matrix material; and
      nano-crystalline nitride material grains suspended within the matrix material.

19. The protective cover of claim 18, wherein the crystalline material grains include nano-crystalline structures and the matrix material is an amorphous material.

20. The protective cover of claim 19, wherein:
the nano-crystalline structures have a size between 2 nanometers and 12 nanometers; and
adjacent nano-crystalline structures are separated by a distance of approximately 1 to 5 nanometers.

21. The protective cover of claim 18, further comprising:
a second nano-crystalline layer overlying and separated from the nano-crystalline layer by a non-crystalline layer.

22. The protective cover of claim 18, wherein:
the matrix material is formed from an oxide-based material; and
the crystalline material grains are formed from one or more of: carbon nitride, silicon nitride, aluminum nitride, or oxynitride.

23. The protective cover of claim 18, wherein the crystalline material grains comprise:
a first group of crystalline material grains having a first characteristic; and
at least one distinct group of crystalline material grains having a second characteristic, the second characteristic different from the first characteristic.

24. A method of forming a transparent protective coating on a glass substrate, the method comprising:
depositing a matrix material over a surface of the glass substrate;
implanting ions into the matrix material; and
annealing the matrix material to form a group of nano-crystalline nitride structures suspended within the matrix material.

25. The method of claim 24, wherein implanting ions into the matrix material is performed while annealing the matrix material.

26. The method of claim 24, wherein the annealing is performed at a temperature between 100 and 900 degrees Celsius.

27. The method of claim 24, wherein:
implanting ions into the matrix material comprises providing accelerated ions to the matrix material; and
annealing the matrix material comprises introducing thermal energy to achieve phase segregation within the matrix material.

28. The method of claim 24, wherein implanting the ions into the matrix material is performed while depositing the matrix material over a first surface of the glass substrate.

29. The method of claim 24, wherein implanting the ions into the matrix material further comprises:
implanting a first group of nano-crystalline material structures having a first characteristic into the matrix material; and
implanting a second group of nano-crystalline material structures having a second characteristic into the matrix material, the second characteristic different from the first characteristic.

* * * * *